United States Patent
Liu et al.

(10) Patent No.: US 10,756,122 B2
(45) Date of Patent: Aug. 25, 2020

(54) PRODUCTION METHOD OF AN ARRAY SUBSTRATE OF A DISPLAY DEVICE USING TFT AS A PIXEL CONTROL UNIT

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhaofan Liu, Beijing (CN); Yijun Wang, Beijing (CN); Na Zhao, Beijing (CN); Qiyu Shen, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 16/016,964

(22) Filed: Jun. 25, 2018

(65) Prior Publication Data
US 2019/0157303 A1    May 23, 2019

(30) Foreign Application Priority Data
Nov. 20, 2017    (CN) .......................... 2017 1 1160556

(51) Int. Cl.
*H01L 27/12* (2006.01)
*H01L 29/786* (2006.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
CPC ............... H01L 27/1288; H01L 27/124; H01L 29/41733; H01L 29/786; H01L 29/78678; H01L 29/78669
See application file for complete search history.

(56) References Cited

U.S. PATENT DOCUMENTS

2004/0089900 A1* 5/2004 Ishikawa ............... G02F 1/1368
257/347
2007/0155034 A1* 7/2007 Lee ...................... H01L 27/1255
438/30
(Continued)

FOREIGN PATENT DOCUMENTS

CN    102566179 A    7/2012
CN    103367166 A    10/2013
(Continued)

OTHER PUBLICATIONS

First Chinese Office Action dated Oct. 21, 2019, received for corresponding Chinese Application No. 201711160556.7, 13 pages.

*Primary Examiner* — Allen L Parker
*Assistant Examiner* — Gustavo G Ramallo
(74) *Attorney, Agent, or Firm* — Kinney & Lange, P.A.

(57) ABSTRACT

There is provided a manufacture method of an array substrate of a display device using TFT as a pixel control unit, an array substrate, and a display apparatus. In this method, when a data line and source and drain electrodes of a TFT are prepared, a half-tone mask is used to retain at least one part of a photoresist on the data line; and the retained photoresist is softened by heating so that the at least one part of the data line is coated by the retained photoresist.

13 Claims, 4 Drawing Sheets

(51) Int. Cl.
*G02F 1/1368* (2006.01)
*G02F 1/1362* (2006.01)
*H01L 29/417* (2006.01)

(52) U.S. Cl.
CPC ........ *H01L 27/127* (2013.01); *H01L 27/1288* (2013.01); *H01L 29/41733* (2013.01); *H01L 29/786* (2013.01); *H01L 29/78669* (2013.01); *H01L 29/78678* (2013.01); *G02F 2201/123* (2013.01)

(56) References Cited

U.S. PATENT DOCUMENTS

| | | |
|---|---|---|
| 2012/0190143 A1 | 7/2012 | Lee et al. |
| 2014/0159034 A1* | 6/2014 | Yang ................... H01L 27/1288 257/43 |
| 2015/0228760 A1* | 8/2015 | Wei ....................... H01L 21/283 257/66 |
| 2016/0322404 A1* | 11/2016 | Jiang ................. H01L 29/78669 |
| 2016/0343735 A1 | 11/2016 | Chen et al. |
| 2016/0358953 A1* | 12/2016 | Zhang ................. H01L 21/0217 |
| 2018/0122924 A1* | 5/2018 | Niu ..................... H01L 29/7869 |
| 2018/0336832 A1 | 11/2018 | Chen |

FOREIGN PATENT DOCUMENTS

| | | |
|---|---|---|
| CN | 104835782 A | 8/2015 |
| CN | 106526992 A | 3/2017 |
| CN | 107104044 A | 8/2017 |

\* cited by examiner

PRODUCTION METHOD OF AN ARRAY SUBSTRATE OF A DISPLAY DEVICE USING TFT AS A PIXEL CONTROL UNIT

CROSS-REFERENCE TO RELATED APPLICATION

This disclosure claims the priority of Chinese Patent Application No. 201711160556.7 filed on Nov. 20, 2017, which is incorporated herein by reference in its entirety.

TECHNICAL FIELD

This disclosure relates to the technical field of displays, and particularly refers to a method of manufacture of an array substrate, an array substrate, and a display apparatus.

BACKGROUND ART

A display device using a thin-film transistor (TFT) as a pixel control unit, such as a TFT-LCD (thin-film transistor liquid crystal display) is predominant in the market of current flat panel displays due to features such as small volume, low energy consumption, no radiation, and the like.

In such a display device, a source electrode and a drain electrode of a TFT are typically formed concurrently with a data line connected to one of the electrodes in a one-time patterning process. A parasitic capacitance is present between the data line and a pixel electrode, which may result in problems such as crosstalk and the like.

SUMMARY OF THE INVENTION

This disclosure provides a manufacture method of an array substrate of a display device using TFT as a pixel control unit, including: forming a conductive material layer; covering the conductive material layer with a photoresist layer; exposing the photoresist layer by using a half-tone mask plate; developing the photoresist layer after exposure to form a photoresist complete retention area, a photoresist partial retention area, and a photoresist complete removal area; etching the conductive material layer in the photoresist complete removal area to form a data line and a source electrode and a drain electrode of the TFT, wherein at least one part of the data line lies in the photoresist complete retention area, and at least one part of the source electrode and the drain electrode lies in the photoresist partial retention area; removing the photoresist in the photoresist partial retention area while retaining at least one part of the photoresist in the photoresist complete retention area; and softening the retained photoresist by heating so that the at least one part of the data line is coated by the retained photoresist.

Optionally, the heating has a temperature range of 250° C. to 350° C.

Optionally, the heating has a period of 5 minutes to 30 minutes.

Optionally, the photoresist is an organic insulating material.

Optionally, the data line all lies in the photoresist complete retention area.

Optionally, the photoresist partial retention area is on one of the source electrode and the drain electrode which is not connected to the data line.

Optionally, the photoresist is a positive photoresist, and the half-tone mask plate has a non-transmitting area corresponding to the photoresist complete retention area, a partly transmitting area corresponding to the photoresist partial retention area, and a transmitting area corresponding to the photoresist complete removal area.

Optionally, the photoresist is a negative photoresist, and the half-tone mask plate has a non-transmitting area corresponding to the photoresist complete removal area, a partly transmitting area corresponding to the photoresist partial retention area, and a transmitting area corresponding to the photoresist complete retention area.

Optionally, removing the photoresist in the photoresist partial retention area while retaining at least one part of the photoresist in the photoresist complete retention area is achieved by ashing treatment.

Optionally, the manufacture method further includes: before forming the conductive material layer on an active layer, forming a gate metal layer on a base substrate by a one-time patterning process; forming a gate insulating layer on the gate metal layer by a one-time patterning process; and forming an active layer on the gate insulating layer by a one-time patterning process.

Optionally, after the at least one part of the data line is coated by the retained photoresist, a passivation layer on the data line and the TFT is formed.

Optionally, the manufacture method further includes: forming a pixel electrode electrically connected to the at least one part of the source electrode and the drain electrode.

This disclosure further provides an array substrate produced by using the manufacture method described above.

This disclosure further provides a display apparatus that includes the array substrate described above.

DESCRIPTION OF EMBODIMENTS

Figure 1:
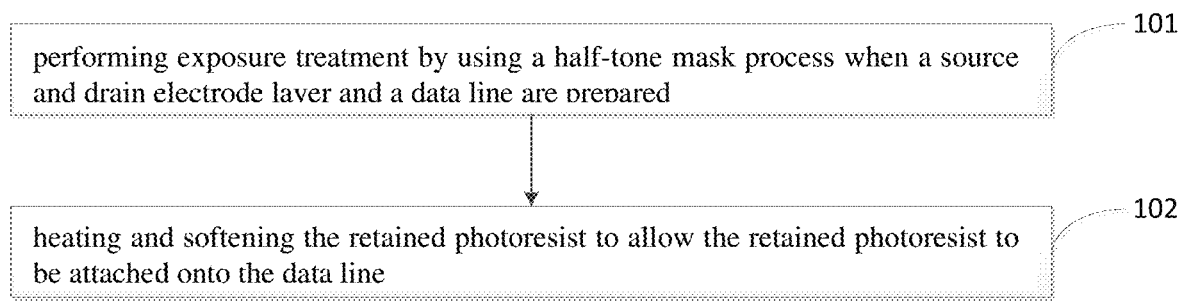
FIG. 1 is a flow chart of an example of a manufacture method of an array substrate provided in this disclosure.

In order to enable objects, technical solutions, and advantages of this disclosure to be more obvious and clear, this disclosure will be further illustrated in detail in conjunction with specific embodiments and with reference to figures.

It is to be indicated that all expressions of "first" and "second" used in embodiments of this disclosure are intended to distinguish two different entities or different parameters having the same name. As can be seen, "first" and "second" are merely for the purpose of the convenience of expression, and should not be construed as limitations of embodiments of this disclosure, and descriptions for this are omitted in subsequent embodiments.

Display devices using a TFT (thin-film transistor) as a pixel control unit include TFT-LCDs, TFT-OLEDs, and the like. In an array substrate of such a display device, TFT control units are provided for each pixel. For example, a TFT-LCD device is formed by cell-aligning an array glass substrate and a color filter glass substrate. Gate electrode scan lines and data lines, which define pixel areas, are oppositely and staggeredly provided in an array substrate. A pixel electrode and a thin-film transistor are provided in each pixel area. In this way, there is certainly a position where a data line and a pixel electrode are relatively adjacent and the parasitic capacitance between the data line and the pixel electrode (such as an ITO electrode) is excessively large, which brings about various risks such as the problem of crosstalk or the increase in energy consumption. Therefore, in order to prevent the occurrence of the phenomena described above, it is typically required to add a layer of an organic film between ITO and a data line to reduce the parasitic capacitance between ITO and the data line, so that interaction between ITO and the data line is weakened. In existing solutions, however, if a layer of an organic film is required to be added, then it is required to correspondingly add a mask process, which severely impacts the throughput and the yield rate.

Therefore, in the process of implementing this disclosure, the inventor has found that the following problems are at least present in the related art. Currently, when solving the problem of the parasitic capacitance between ITO and the data line, a mask process is necessarily added, which not only delays the throughput rate but also impacts the final yield rate of products.

In view of this, an object of this disclosure is to provide a manufacture method of an array substrate, an array substrate, and a display apparatus. A method which can reduce the parasitic capacitance between ITO and the data line without adding any mask process may be provided, and in turn the generation process, the generation efficiency, and the quality of the array substrate are improved.

In a display device using a TFT as a pixel control unit, typically, a data line is connected to one electrode of the source electrode and the drain electrode and the other electrode is connected to a pixel electrode. Thus, connection and disconnection between the pixel electrode and the data line may be controlled by switching on/off the TFT of each pixel. In a conventional process of preparing a display device using a TFT as a pixel control unit, patterns of a data line, a source electrode, and a drain electrode are typically formed by a photolithographic process in one-time patterning. Specifically, a mask plate is used to pattern a photoresist applied on a conductive material layer by exposure and development, and the exposed conductive material layer is etched off, so as to form a data line, a source electrode, and a drain electrode. Finally, the photoresist is removed.

As described above, in order to reduce the parasitic capacitance, another photolithographic process is typically performed to form an organic film coating data lines.

In one embodiment of this disclosure, there is provided a manufacture method of an array substrate of a display device using TFT as a pixel control unit, including: forming a conductive material layer; covering the conductive material layer with a photoresist layer; exposing the photoresist layer by using a half-tone mask plate; developing the photoresist layer after exposure to form a photoresist complete retention area, a photoresist partial retention area, and a photoresist complete removal area; etching the conductive material layer in the photoresist complete removal area to form a data line and a source electrode and a drain electrode of the TFT, wherein at least one part of the data line lies in the photoresist complete retention area, and at least one part of the source electrode and the drain electrode lies in the photoresist partial retention area; removing the photoresist in the photoresist partial retention area while retaining at least one part of the photoresist in the photoresist complete retention area; and softening the retained photoresist by heating so that the at least one part of the data line is coated by the retained photoresist.

In the method of this disclosure, when patterns of the data line and the TFT electrode are formed, a conventional photolithographic process is used. Specifically, after a photoresist layer is applied on a conductive material layer, exposure and development are performed by using a half-tone mask plate. The photoresist in a photoresist complete removal area is first removed, and the photoresist in a photoresist complete retention area and a photoresist partial retention area is retained. Subsequently, the conductive material layer is etched to form a data line and a source electrode and a drain electrode of a TFT. Thereafter, the photoresist is subjected to further treatment to remove the photoresist in a photoresist partial retention area while retaining the photoresist in a photoresist complete retention area. Thus, the conductive material of at least one part of one of the source electrode and the drain electrode is exposed, and the photoresist is still retained on the conductive material of the data line. The photoresist may be retained or may not be retained in other parts of the source electrode and the drain electrode, and this is not limited in this disclosure. The exposed conductive material in the source electrode and the drain electrode are used to be electrically communicated with a pixel electrode. This is why the half-tone mask plate is used in this disclosure. The photoresist retained on the data line is softened and coats the data line, so as to exert an effect of reducing the parasitic capacitance.

In this disclosure, the photoresist on the data line, which is used when the data line, the source electrode, and the drain electrode are formed, is not completely removed and is directly used as an organic material for reducing the parasitic capacitance. Therefore, a photolithographic process of coating an organic film of the data line is not required to be individually performed.

It is to be noted that the problem of parasitic capacitance typically occurs in the part of the data line but not the part of TFT electrodes. Therefore, the object of this disclosure may be achieved as long as the part of the data line is ensured to be covered with the photoresist. The photoresist may be retained or may not be retained on the electrode. However, there must be at least one area in which the photoresist is not retained, in the part of the electrode, the area being used for connection (alternatively stated lapped) with the pixel electrode.

In a TFT, a source electrode and a drain electrode are symmetrical, and a data line may be connected to the source electrode or may be connected to the drain electrode. The data line is connected to any one of the electrodes, as long as there is a photoresist partial retention area on the other electrode.

The heating may have a temperature range of 250° C. to 350° C. Optionally, the heating may have a period of 5 minutes to 30 minutes. The parts of the array substrate, which have been formed, will not be damaged in this temperature range. In this time range, it may be ensured that the photoresist is sufficiently softened to coat the data line and the processing time is not excessively elongated.

The photoresist may be an organic insulating material. The organic insulating material has a low dielectric coefficient and may effectively reduce the parasitic capacitance.

The data line may all lie in the photoresist complete retention area, so as to sufficiently reduce the parasitic capacitance between the data line and the pixel electrode.

The photoresist partial retention area may be on one of the source electrode and the drain electrode which is not connected to the data line. For example, if the data line is connected to the source electrode, the photoresist partial retention area is on the drain electrode. If the data line is connected to the drain electrode, the photoresist partial retention area is on the source electrode. The photoresist in the photoresist partial retention area is subsequently removed, and a part of the source electrode or the drain electrode is exposed to be electrically communicated with the pixel electrode.

The photoresist may be a positive photoresist. At this point, the half-tone mask plate has a non-transmitting area corresponding to the photoresist complete retention area, a partly transmitting area corresponding to the photoresist partial retention area, and a transmitting area corresponding to the photoresist complete removal area.

The photoresist may also be a negative photoresist. At this point, the half-tone mask plate has a non-transmitting area corresponding to the photoresist complete removal area, a partly transmitting area corresponding to the photoresist partial retention area, and a transmitting area corresponding to the photoresist complete retention area.

Removing the photoresist in the photoresist partial retention area while retaining at least one part of the photoresist in the photoresist complete retention area may be achieved by ashing treatment. In the process of ashing treatment, the amount of the photoresist in the photoresist complete retention area may be reduced at the same time.

The manufacture method may further include: forming a gate metal layer on a base substrate by a one-time patterning process; forming a gate insulating layer on the gate metal layer by a one-time patterning process; forming an active layer on the gate insulating layer by a one-time patterning process; and forming the conductive material layer on the active layer. Thereby, a TFT pixel control unit is formed.

The manufacture method may further include: forming a passivation layer on the data line and the TFT after coating the at least one part of the data line by the retained photoresist.

The manufacture method may further include: forming a pixel electrode electrically connected to the at least one part of the source electrode and the drain electrode.

The manufacture method of the array substrate may also be compatible with other steps in the related art. For example, a through hole is formed in a passivation layer and is used to electrically communicate the pixel electrode with the TFT.

With reference to FIG. 1, there is shown a flow chart of an example of a manufacture method of an array substrate provided in this disclosure. As can be known from the figure, the manufacture method of the array substrate comprises Step 101 and Step 102. Step 101 includes performing exposure treatment by using a half-tone mask process when a source and drain electrode layer and a data line are prepared. This step is used to allow the photoresist on the data line to be retained. Here, a fully transmitting area, a semi-transmitting area, and a non-transmitting area are present in a half-tone mask plate. Therefore, the photoresist on the data line may be allowed to be retained upon exposure. Then, by etching treatment and a subsequent ashing process, the photoresist on the data line may be retained while the photoresist in other positions is removed. That is, an organic film layer, which is required to be added in the process of solving the existing problem of parasitic capacitance, is replaced by the photoresist, so that a layer of photoresist is added between the data line and the pixel electrode (ITO) without adding a mask procedure. That is, the parasitic capacitance is reduced, and thus the energy consumption is reduced.

Optionally, the photoresist employs an organic film material which may reduce the parasitic capacitance between the data line and ITO. That is, it may be directly allowed that the photoresist employs a material which is the same as that of the organic film layer used in solutions in the related art. Therefore, the photoresist retained in this disclosure may also exert an effect of reducing the parasitic capacitance. Of course, any other corresponding material, which may be suitable to reduce the parasitic capacitance, may be used. This is not limited in this disclosure.

Step 102 includes heating and softening the retained photoresist to allow the retained photoresist to be attached onto the data line. The procedure of an exposure process will allow the photoresist on the data line to be retained, but the positions on both sides of the data line are not coated by the photoresist. Therefore, this disclosure proposes that the retained photoresist and the data line should be completely bonded together in a manner of heating and softening the photoresist. In this way, a stable and reliable layered structure may be formed in subsequent preparation of structures such as a passivation layer and the like.

It is to be indicated that this disclosure is improved mainly in the preparation processes of the source and drain electrode layer and the data line. Whereas, the preparation of the array substrate actually further comprises various layers of structures such as a gate electrode, a gate insulating layer, a passivation layer, a pixel, and the like. Therefore, corresponding preparation processes are required both before Step 101 described above and after Step 102. This is not described in detail in this disclosure.

As can be known from the example described above, in the manufacture method of the array substrate in this disclosure, by performing exposure treatment by using a half-tone mask process after the coating of photoresist is complete when a source and drain electrode layer and a data line are prepared on an active layer, the photoresist on the data line is allowed to be retained. Then, after etching, by heating and softening the retained photoresist, the photoresist is in turn allowed to be exactly bonded and attached onto the data line. In this way, after a passivation layer and an ITO layer are prepared, a layer of photoresist is added between the data line and the ITO layer. That is, the parasitic capacitance between the data line and the ITO layer is allowed to be greatly reduced. Additionally, since the photoresist on the data line is directly retained by a half-tone mask process in this disclosure, there is no need to additionally add an organic film layer by a mask process after the photoresist is removed. This simplifies the process flow, and in turn it is possible to improve the processing efficiency, reduce the cost, and improve the yield rate of products. Therefore, the manufacture method of the array substrate in this disclosure may provide a method which can reduce the parasitic capacitance between ITO and the data line without adding any mask process, and in turn the generation process, the generation efficiency, and the product quality of the array substrate are improved.

Figure 2:
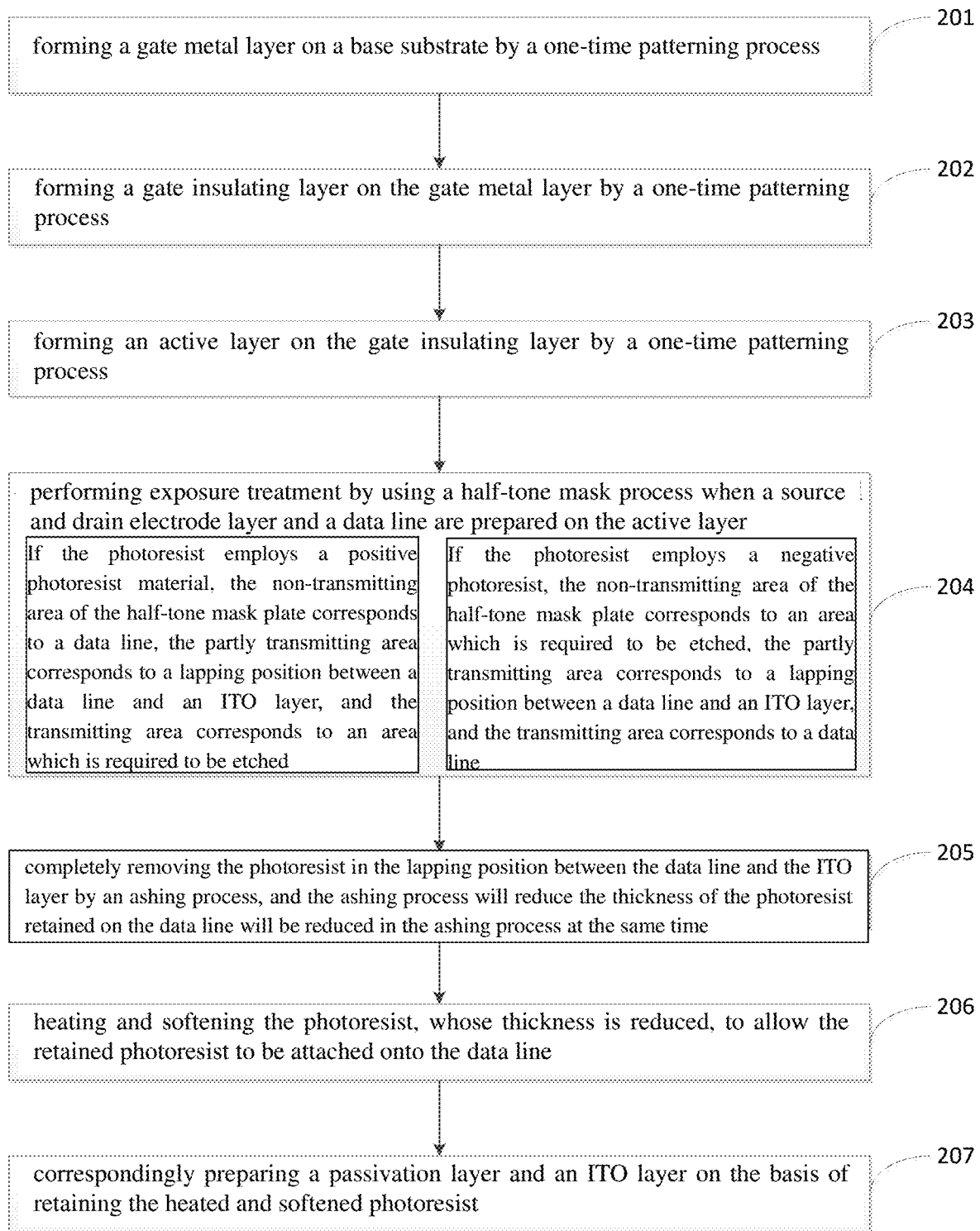
FIG. 2 is a flow chart of another example of a manufacture method of an array substrate provided in this disclosure.

With reference to FIG. 2, there is shown a flow chart of another example of a manufacture method of an array substrate provided in this disclosure. Here, a pixel electrode is illustrated by taking an ITO layer as an example. As can be known from the figure, before the step of performing exposure treatment by using a half-tone mask process when a source and drain electrode layer and a data line are prepared, it further includes: Step 201, Step 202, Step 203, Step 204, Step 205, Step 206, and Step 207.

Step 201 includes forming a gate metal layer on a base substrate by a one-time patterning process. The base substrate is typically a glass substrate. The one-time patterning process comprises procedures such as thin film deposition, exposure, etching, peeling, and the like.

Step 202 includes forming a gate insulating layer on the gate metal layer by a one-time patterning process.

Step 203 includes forming an active layer on the gate insulating layer by a one-time patterning process.

Step 204 includes performing exposure treatment by using a half-tone mask process when a source and drain electrode layer and a data line are prepared on the active layer. Thereby, the photoresist on the data line is allowed to be retained.

Specifically, Step 204 described above includes the following.

If the photoresist employs a positive photoresist material, the non-transmitting area of the half-tone mask plate corresponds to a data line, the partly transmitting area corresponds to a lapping position between a data line and an ITO layer, and the transmitting area corresponds to an area which is required to be etched.

If the photoresist employs a negative photoresist, the non-transmitting area of the half-tone mask plate corresponds to an area which is required to be etched, the partly transmitting area corresponds to a lapping position between a data line and an ITO layer, and the transmitting area corresponds to a data line.

Thus, the photoresist on the data line may be all retained after exposure treatment. Specifically, whether selecting a positive photoresist material or a negative photoresist material may be correspondingly adjusted according to the requirements of the design and the process. This is not limited in this disclosure.

Additionally, after performing exposure treatment by a half-tone mask process, the photoresist in the lapping position between the data line and ITO is required to be removed, and therefore thickness reduction treatment is required to be performed by an ashing process. Specifically, after the step of performing exposure treatment by using a half-tone mask process, it further includes:

Step 205, which includes completely removing the photoresist in the lapping position between the data line and the ITO layer by an ashing process, and the ashing process will reduce the thickness of the photoresist retained on the data line will be reduced in the ashing process at the same time. Thus, the photoresist on the data line may be retained, while the photoresist in the lapping position may be removed.

Step 206, which includes heating and softening the photoresist, whose thickness is reduced, to allow the retained photoresist to be attached onto the data line.

Optionally, the heating temperature when heating and softening the retained photoresist is in a range of 250° C. to 350° C. For example, the heating temperature may be a temperature such as 250° C., 260° C., 280° C., 300° C., 320° C., 340° C., 350° C., and the like. The heating time when heating and softening the retained photoresist is 5 minutes to 30 minutes. For example, the heating time may be a time such as 5 minutes, 10 minutes, 15 minutes, 20 minutes, 25 minutes, 30 minutes, and the like. Specifically, the heating temperature and the heating time may be correspondingly designed and adjusted according to material properties and the corresponding thickness of the photoresist used, or may be tested and adjusted according to practical generation tests. Thus, the retained photoresist may be allowed to be exactly bonded onto the data line so as to exert an effect of inserting a material with a low dielectric coefficient between the data line and ITO and in turn reducing the parasitic capacitance.

Finally, after the step of heating and softening the retained photoresist, it further includes Step 207, which includes correspondingly preparing a passivation layer and an ITO layer on the basis of retaining the heated and softened photoresist.

In this example, a general process flow of preparation of the entire array substrate is not only disclosed in detail, but a process flow of a method in which the photoresist on the data line is retained by exposure treatment of a half-tone mask process is also disclosed in detail, so that the manufacture method of the array substrate in this disclosure is not only easily achieved but is also well able to be combined with an existing process of preparing an array substrate, and is suitable for popularization and application.

In another aspect, this disclosure further provides an array substrate produced by the manufacture method of the array substrate in any one of the embodiments described above.

Figure 3:
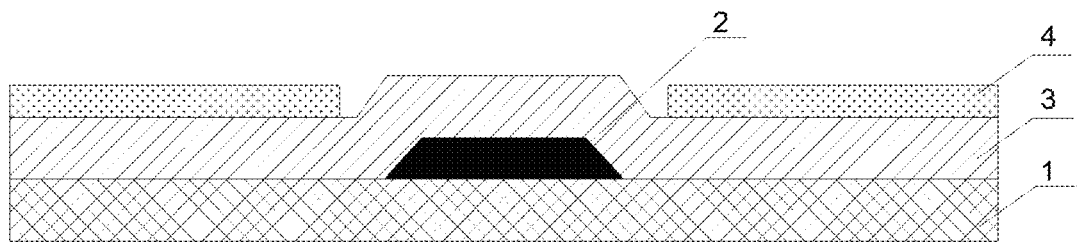
FIG. 3 is a structural schematic diagram near a data line of an array substrate in the related art.

With reference to FIG. 3, there is shown a structural schematic diagram near a data line of an array substrate in the related art. As can be known from the figure, the data line 2 is provided on the gate insulating layer 1, and the pixel electrode 4 and the data line 2 are then separated by the passivation layer 3; and the pixel electrode 4 (such as an ITO electrode) and the data line 2 are separated only by a PVX (passivation layer). Since the passivation layer has a relatively high dielectric coefficient and a limited thickness, the parasitic capacitance (Cpd) between ITO and the data line is relatively large, and problems such as crosstalk of signals and the like are easily brought about.

Figure 4:
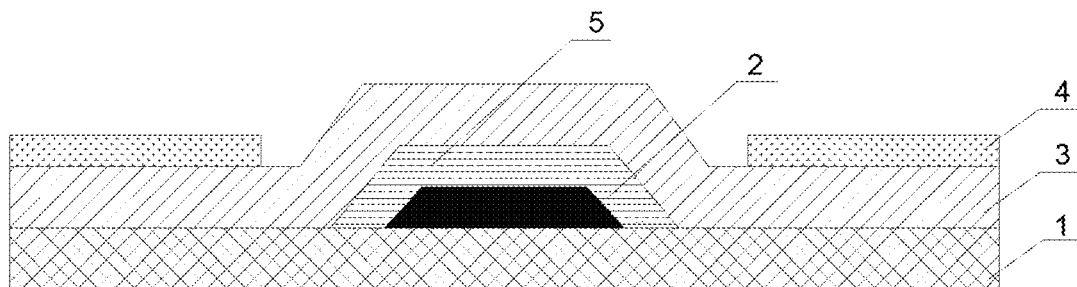
FIG. 4 is a structural schematic diagram near a data line in an embodiment of an array substrate provided in this disclosure.

With reference to FIG. 4, there is shown a structural schematic diagram of an embodiment near a data line of an array substrate provided in this disclosure. As can be known from the figure, a layer of photoresist 5 is added between the passivation layer 3 and the data line 2 in an array substrate corresponding to this disclosure, such that a material with a low dielectric coefficient is present and the distance is increased between the data line 2 and the pixel electrode 4, and in turn the parasitic capacitance may be reduced. Specifically, in this disclosure, the photoresist 5 on the data line 2 is heated, softened, and attached onto the data line 2, and the insulating layer 3 and the pixel electrode 4 are then prepared. Since the photoresist 5 is added between the data line 2 and the pixel electrode 4, the parasitic capacitance is reduced. Optionally, the photoresist is allowed to employ a material which is the same as that of a conventional organic film layer for reducing the parasitic capacitance. Existing materials may be directly used, and it is favorable to popularization and implementation. Such materials include an organic insulating material with a low dielectric coefficient.

Figure 5:
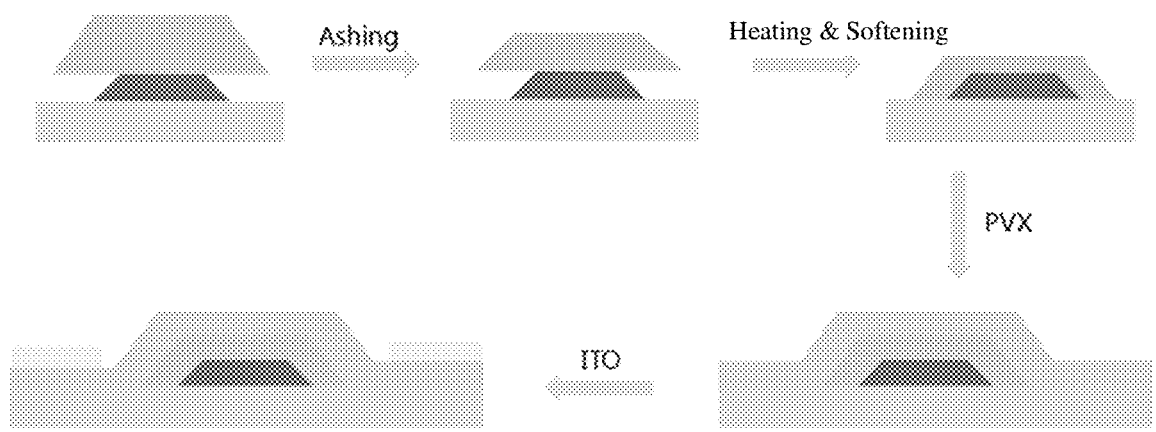
FIG. 5 is a structural schematic diagram near a data line in a part of a process flow of the preparation of an array substrate provided in this disclosure.

With reference to FIG. 5, there is shown a structural schematic diagram near a data line in a part of a process flow of the preparation of an array substrate provided in this disclosure. As can be known from the figure, a thick layer of photoresist will be retained on the data line after exposure. Meanwhile, some photoresist will be also present in an area of the source electrode or the drain electrode which is not connected to the data line and is to be lapped with the pixel electrode. The photoresist in the area of the source electrode or the drain electrode to be lapped with the pixel electrode is removed by an ashing process, while the thickness of the photoresist on the data line will be also reduced. The photoresist is then attached onto the data line by heating and softening, and the passivation layer (PVX) and the pixel electrode (ITO) are finally prepared.

It is noted that the data line is narrower than the above photoresist layer as shown in FIG. 5. This is because the data line is typically obtained by wet etching. The photoresist layer drawn as a trapezoid does not have any particular sense. It is to be noted that FIG. 5 is a schematic illustration only, and shapes and scales therein do not limit this disclosure.

Figure 6:
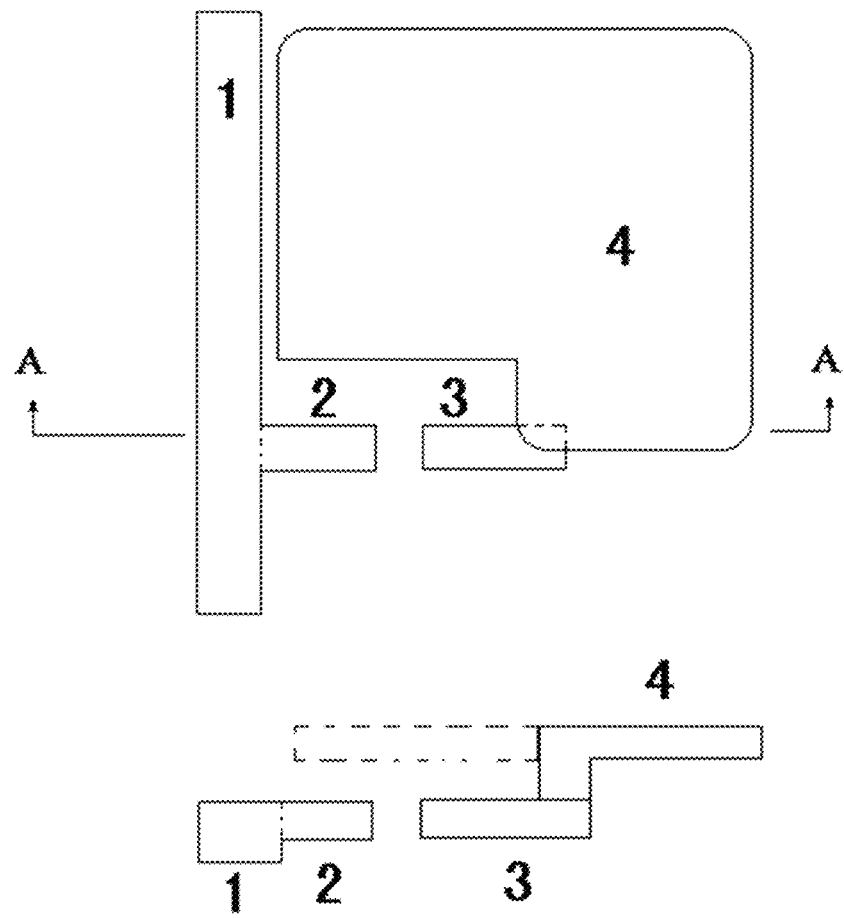
FIG. 6 is a structural schematic diagram near a TFT in the preparation of an array substrate provided in this disclosure.

FIG. 6 shows a structural schematic diagram near a TFT in the preparation of an array substrate provided in this disclosure, wherein the top panel is a top view and the bottom panel is a sectional view along A-A. In the figure, 1 is a data line, 2 is a source electrode (or a drain electrode), 3 is a drain electrode (or a source electrode), and 4 is a pixel electrode. In this disclosure, the photoresist in the photoresist complete removal area except 1, 2, and 3 is first removed to form 1, 2, and 3. Subsequently, the photoresist in the photoresist partial retention area is removed. This photoresist partial retention area at least comprises a part where the electrode 3 and the pixel electrode 4 are lapped, so that this part of the electrode is exposed to be electrically connected to the pixel electrode. The photoresist in the photoresist complete retention area on the data line 1 is retained and is subsequently softened as shown in FIG. 5 to coat the data line, so as to reduce the parasitic capacitance between the data line 1 and the pixel electrode 4. It is to be noted that FIG. 6 is a schematic illustration only, and shapes and scales therein do not limit this disclosure.

In another aspect of this disclosure, there is further provided a display apparatus, comprising the array substrate of the embodiments described above.

As can be seen from those described above, with respect to the manufacture method of the array substrate, the array substrate, and the display apparatus provided in this disclosure, by performing exposure treatment by using a half-tone mask process after the coating of photoresist is complete when a source and drain electrode layer and a data line are prepared on an active layer, the photoresist on the data line is allowed to be retained. Then, after etching, by heating and softening the retained photoresist, the photoresist is in turn allowed to be exactly bonded and attached onto the data line. In this way, after a passivation layer and an ITO layer are prepared, a layer of photoresist is added between the data line and the ITO layer. That is, the parasitic capacitance between the data line and the ITO layer is allowed to be greatly reduced. Additionally, since the photoresist on the data line is directly retained by a half-tone mask process in this disclosure, there is no need to additionally add an organic film layer by a mask process. This simplifies the process flow, and in turn it is possible to improve the processing efficiency, reduce the cost, and improve the yield rate of products. Therefore, the manufacture method of the array substrate, the array substrate, and the display apparatus in this disclosure may provide a method which can reduce the parasitic capacitance between ITO and the data line without adding any mask process, and in turn the generation process, the generation efficiency, and the product quality of the array substrate are improved.

It is to be understood by one of ordinary skilled in the art that the discussion of any above embodiment is merely exemplary and is not intended to imply that the scope (including claims) of this disclosure is limited to these examples; and under the idea of this disclosure, in an embodiment or different embodiments, technical features may be combined with others, steps may be implemented in any order, and there are a plurality of other changes in different aspects of this disclosure as described above. For the purpose of simplicity, those are not provided in detail.

Embodiments of this disclosure are intended to encompass all such replacements, modifications and variations which fall in a wide scope of appended claims. Therefore, all of omissions, modifications, equivalent replacements, improvements, and the like, which are within the spirit and the principle of this disclosure, should be encompassed in the scope protected by this disclosure.

What is claimed is:

1. A manufacture method of an array substrate of a display device using thin-film transistor (TFT) as a pixel control unit, the manufacture method comprising:

forming a conductive material layer;

covering the conductive material layer with a photoresist layer;

exposing the photoresist layer by using a half-tone mask plate;

developing the photoresist layer after exposure to form a photoresist complete retention area, a photoresist partial retention area, and a photoresist complete removal area;

etching the conductive material layer in the photoresist complete removal area to form a data line, a source electrode, and a drain electrode of the TFT, wherein at least one part of the data line lies in the photoresist complete retention area, and at least one part of the source electrode and the drain electrode lies in the photoresist partial retention area;

removing the photoresist in the photoresist partial retention area while retaining at least one part of the photoresist in the photoresist complete retention area;

softening the retained photoresist by heating so that the at least one part of the data line is coated by the retained photoresist; and forming a pixel electrode electrically connected to the at least one part of the source electrode and the drain electrode, wherein after the pixel electrode is formed, an orthogonal projection of the at least one part of the data line coated by the retained photoresist on the array substrate is located within an orthogonal projection of the retained photoresist on the array substrate and does not overlap with an orthogonal projection of the pixel electrode.

2. The manufacture method according to claim 1, wherein the heating has a temperature range of 250° C. to 350° C.

3. The manufacture method according to claim 1, wherein the heating has a period of 5 minutes to 30 minutes.

4. The manufacture method according to claim 1, wherein the photoresist is an organic insulating material.

5. The manufacture method according to claim 1, wherein the data line all lies in the photoresist complete retention area.

6. The manufacture method according to claim 1, wherein the photoresist partial retention area is on one of the source electrode and the drain electrode which is not connected to the data line.

7. The manufacture method according to claim 1, wherein the photoresist is a positive photoresist, and the half-tone mask plate has a non-transmitting area corresponding to the photoresist complete retention area, a partly transmitting area corresponding to the photoresist partial retention area, and a transmitting area corresponding to the photoresist complete removal area.

8. The manufacture method according to claim 1, wherein the photoresist is a negative photoresist, and the half-tone mask plate has a non-transmitting area corresponding to the photoresist complete removal area, a partly transmitting area corresponding to the photoresist partial retention area, and a transmitting area corresponding to the photoresist complete retention area.

9. The manufacturing method according to claim 1, wherein removing the photoresist in the photoresist partial retention area while retaining at least one part of the photoresist in the photoresist complete retention area is achieved by ashing treatment.

10. The manufacture method according to claim 1, further comprising: before forming the conductive material layer on an active layer,
- forming a gate metal layer on a base substrate by a one-time patterning process;
- forming a gate insulating layer on the gate metal layer by a one-time patterning process; and
- forming an active layer on the gate insulating layer by a one-time patterning process.

11. The manufacture method according to claim 1, wherein
- after the at least one part of the data line is coated by the retained photoresist, a passivation layer on the data line and the TFT is formed.

12. An array substrate produced using the manufacture method of claim 1.

13. A display apparatus, comprising the array substrate of claim 12.

* * * * *